(12) United States Patent
Hawwa et al.

(10) Patent No.: US 7,900,690 B2
(45) Date of Patent: Mar. 8, 2011

(54) MOVING CARBON NANOTUBE HEAT SINK

(75) Inventors: Muhammad A Hawwa, Dhahran (SA); Salem A. Al-Dini, Dhahran (SA); Rached Ben-Mansour, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 702 days.

(21) Appl. No.: 12/007,110

(22) Filed: Jan. 7, 2008

(65) Prior Publication Data
US 2010/0263839 A1  Oct. 21, 2010

(51) Int. Cl.
*F28F 5/00* (2006.01)
*B29C 47/88* (2006.01)

(52) U.S. Cl. .......................... 165/86; 165/185

(58) Field of Classification Search .................. 165/86, 165/80.3, 185, 120; 361/697, 702, 709; 174/16.3
See application file for complete search history.

(56) References Cited

U.S. PATENT DOCUMENTS

| | | | |
|---|---|---|---|
| 4,144,932 A | 3/1979 | Voigt | |
| 4,986,346 A * | 1/1991 | Blackmon et al. | 165/86 |
| 5,004,041 A * | 4/1991 | Jaeger | 165/8 |
| 5,062,471 A | 11/1991 | Jaeger | |
| 5,335,143 A | 8/1994 | Maling, Jr. et al. | |
| 5,562,089 A | 10/1996 | Astle, Jr. | |
| 6,000,938 A * | 12/1999 | Melanowicz | 432/250 |
| 6,000,987 A | 12/1999 | Belin et al. | |
| 6,050,326 A | 4/2000 | Evans et al. | |
| 6,175,495 B1 * | 1/2001 | Batchelder | 361/695 |
| 6,333,852 B1 | 12/2001 | Lin | |
| 6,695,974 B2 | 2/2004 | Withers et al. | |
| 6,856,016 B2 * | 2/2005 | Searls et al. | 257/720 |
| 6,921,462 B2 | 7/2005 | Montgomery et al. | |
| 6,955,215 B2 * | 10/2005 | Al-Garni et al. | 165/185 |
| 7,109,581 B2 | 9/2006 | Dangelo et al. | |
| 7,112,472 B2 | 9/2006 | Dubin | |
| 7,118,941 B2 | 10/2006 | Zhang et al. | |
| 7,160,620 B2 | 1/2007 | Huang et al. | |
| 7,641,938 B2 * | 1/2010 | Liu et al. | 427/249.1 |
| 7,656,027 B2 * | 2/2010 | Dangelo et al. | 257/713 |
| 2003/0206796 A1 | 11/2003 | Scholten | |
| 2005/0092464 A1 * | 5/2005 | Leu et al. | 165/80.3 |
| 2005/0269726 A1 | 12/2005 | Matabayas, Jr. | |

FOREIGN PATENT DOCUMENTS

WO   WO 03/107491   12/2003

OTHER PUBLICATIONS http://www.eetimes.com/showArticle.jhtml?articleID=187201574 "Carbon-nanotube arrays take heat off chips" from EE TIMES, dated Jun. 15, 2006.

* cited by examiner

*Primary Examiner* — Tho V Duong
(74) *Attorney, Agent, or Firm* — Richard C. Litman

(57) ABSTRACT

The moving carbon nanotube heat sink includes a heat transfer belt comprised of highly thermally efficient carbon nanotubes. Laterally disposed cooling fins extend away from a top surface of the belt. The belt is slidingly disposed over a C-shaped channel made of metal or other suitable material that is mechanically and/or chemically connected to a top surface of an electronic chip. Belt movement may be powered and guided by a plurality of rollers. The cooling occurs primarily as a result of conduction and convection heat transfer modes.

11 Claims, 7 Drawing Sheets

MOVING CARBON NANOTUBE HEAT SINK

BACKGROUND OF THE INVENTION

1. Field of the Invention

The present invention relates to carbon nanotube cooling devices, and more particularly to a moving carbon nanotube heat sink for integrated circuit chips and the like.

2. Description of the Related Art

High performance microprocessor devices and similar devices utilizing large and very large scale integration of electronic components concentrate heat in a very small space which requires improved thermal cooling to maintain acceptable operating conditions. Over the years, a plethora of solutions addressing the heating problem have been implemented for a variety of applications. For example, thermally conductive pistons, micro bellows, water cooled cold plates, statically disposed heat sink fins, heat pipes, fans and the like have been used to attempt to solve the heating problem associated with these complex, highly integrated electronic circuitry. A conventional technique used to improve thermal performance is to add finned heat sinks to increase the available surface area. Making the fins longer provides increasing thermal performance up to a point. If the fins get too long, the tips of the fins approach ambient temperature and an increase in fin length no longer improves the thermal performance.

A ubiquitous heat transfer mechanism comprises a combination of conduction within the fin, which requires thicker or higher conductivity fins and convection from the fins to the air. Another conventional method to improve thermal performance is by improving air flow. The ultimate performance of an air cooled heat sink, however, is limited by available space, air flow and weight. It should be understood that the aforementioned heat transfer technologies have inefficiencies and cost tradeoffs that have yet to be overcome.

Thus, a moving carbon nanotube heat sink solving the aforementioned problems is desired.

SUMMARY OF THE INVENTION

The moving carbon nanotube heat sink includes a heat transfer belt comprised of highly thermally efficient carbon nanotubes. Laterally extending cooling fins are disposed on an upper surface of the belt. The belt is slidingly disposed over a C-shaped channel made of metal or other suitable material that is mechanically and/or chemically connected to a top surface of an electronic chip. Belt movement may be powered and guided by a plurality of rollers. The cooling occurs primarily as a result of conduction and convection heat transfer modes.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENT

Figure 1:
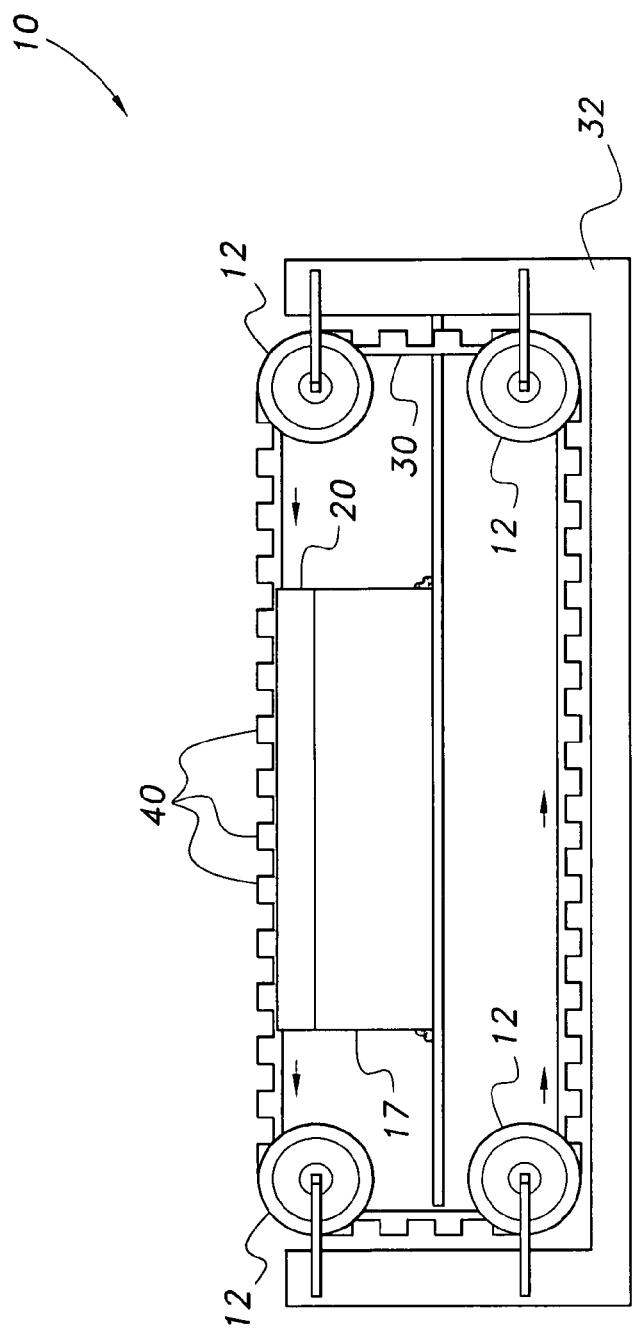
FIG. 1 is an environmental, side view of a moving carbon nanotube heat sink according to the present invention.
Figure 6:
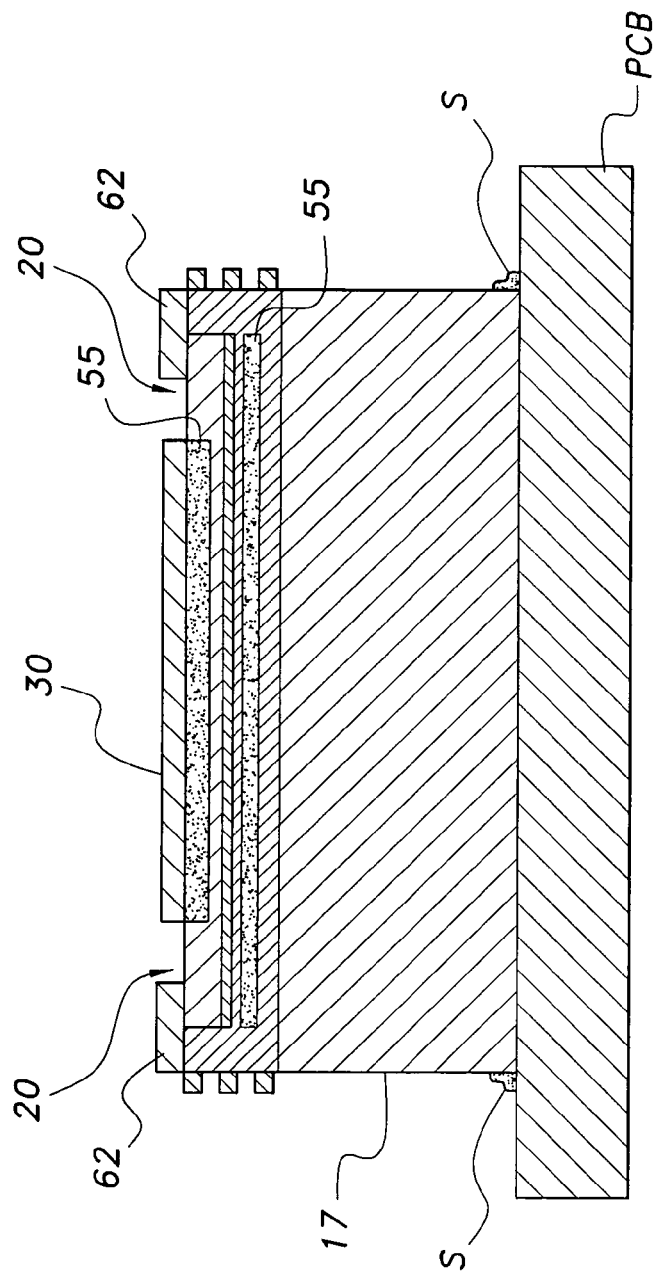
FIG. 6 is a section view of the moving carbon nanotube heat sink atop an integrated circuit according to the present invention.

As shown in FIGS. 1 and 6, the present invention is a moving composite heat sink 10. Each section of a heat transfer belt 30 comprised of highly thermally efficient carbon nanotubes 55 is slidingly disposed through a C-shaped channel 20 which can be made of metal or other suitable material capable of being mechanically and/or chemically connected to a top surface of an electronic chip 17.

After each portion of the moving belt 30 moves through the C-shaped channel 20 connected to the electronic component to be cooled 17 for a limited period of time, it moves from a hot region to a cooler domain. The cooling occurs primarily as a result of conduction and convection heat transfer modes.

Figure 2A:
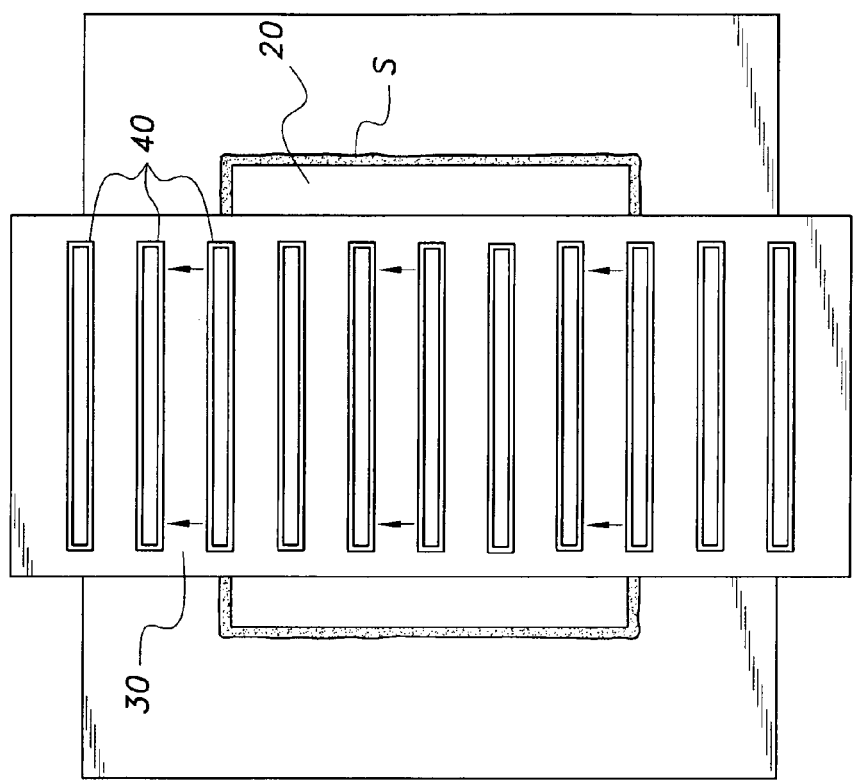
FIG. 2A is an environmental, top view of a moving carbon nanotube heat sink according to the present invention.
Figure 2B:
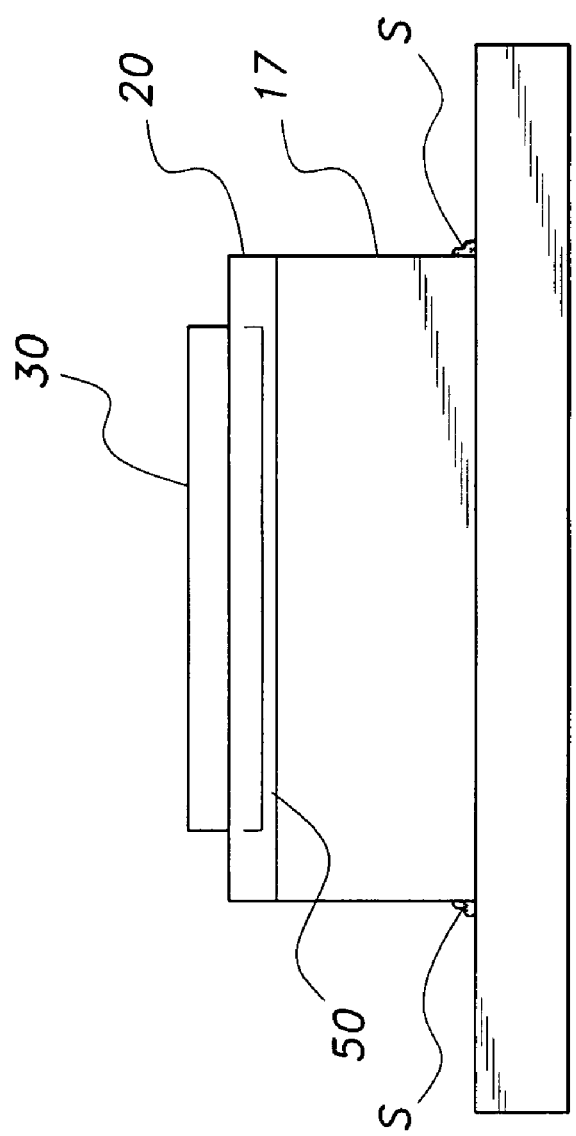
FIG. 2B is an end view of a moving carbon nanotube heat sink according to the present invention.

As shown in FIGS. 1, 2A-2B, the cooling system 10 surrounds an electronic device such as integrated circuit chip 17. When powered up, the chip 17 generates heat that is dissipated by the cooling system 10. The chip 17 may be fixed into a printed circuit board PCB by a solder joint S.

Preferably, circulating composite belt 30 of moving carbon nanotube heat sink 10 has a plurality of fins 40 which are disposed laterally across a portion of the width of belt 30. The fin assembly 40 is preferably made of heat absorbing and dissipating material such as aluminum, copper, and the like. The fins 40 preferably extend away from the belt 30 a predetermined optimum shallow height in order to prevent any "trapped" air pockets. Cross section of the fins 40 may be of a design selected from a variety of different geometries, such as, for example without limitation, semi-circular or sinusoidal.

Figure 3:
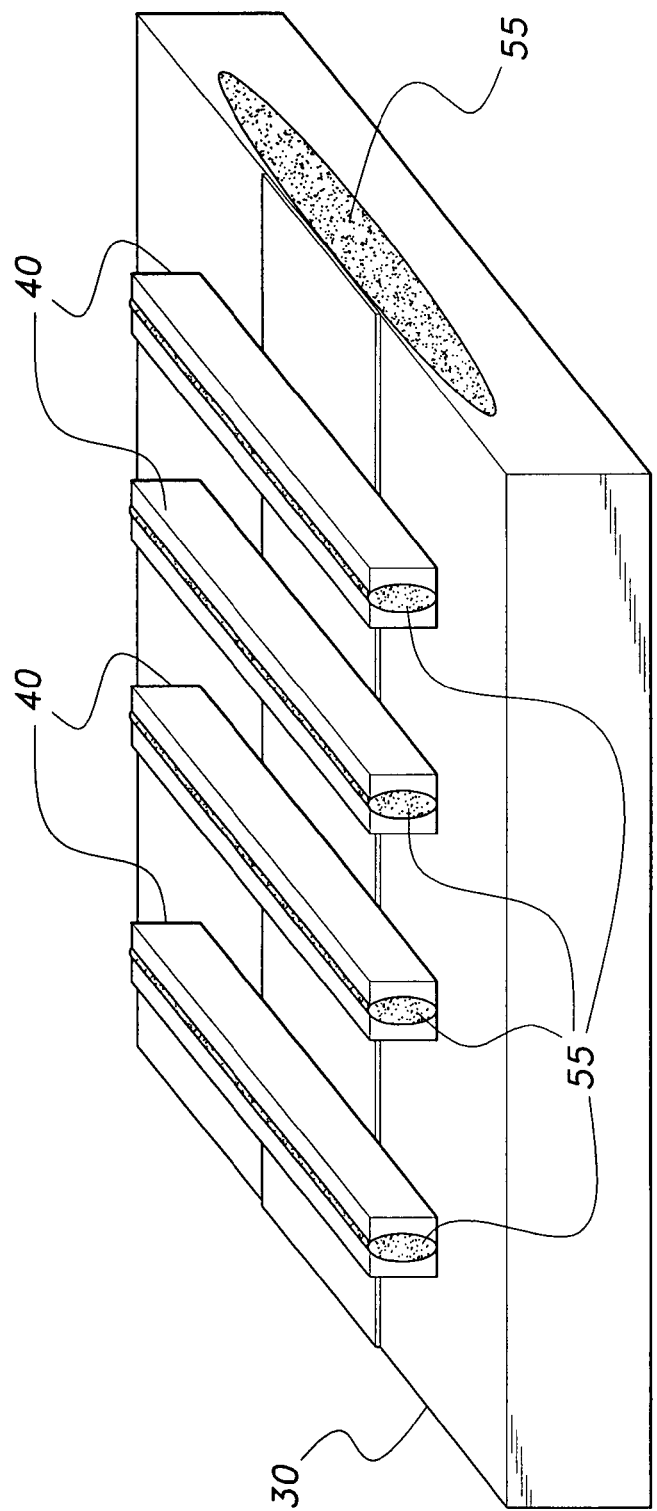
FIG. 3 is a perspective view of the belt and fins of the moving carbon nanotube heat sink according to the present invention.

As shown in FIG. 3, the finned belt 30 may also host a highly heat conductive material to further enhance the heat transfer coefficient. Preferably, the hosted material is a particulate composite comprising a matrix, e.g., resin, and impregnated carbon nanofibers, i.e., nanotubes 55 disposed therein. Axial orientation of the nanotubes 55 is laterally across the belt 30. the nanotubes 55 may also be disposed in the fins 40.

Carbon nanofiber tubes 55 preferably have a diameter of not more than 200 nm and an aspect ratio of at least 0.1. As known in the art, structures such as carbon nanofiber tubes 55 exhibit superior mechanical, electrical, as well as thermal conduction properties. The particulate composite nanotube layers 55 in both belt 30 and fins 40, are preferably disposed so that the nanotube layers 55 extend from within the belt 30 and fins 40 to proximate ambient air exposed surfaces of belt 30 and fins 40. Thus heat is readily transferred from sliding layer 50 of the belt to upper surface of the belt including belt cooling fins 40.

Figure 4:
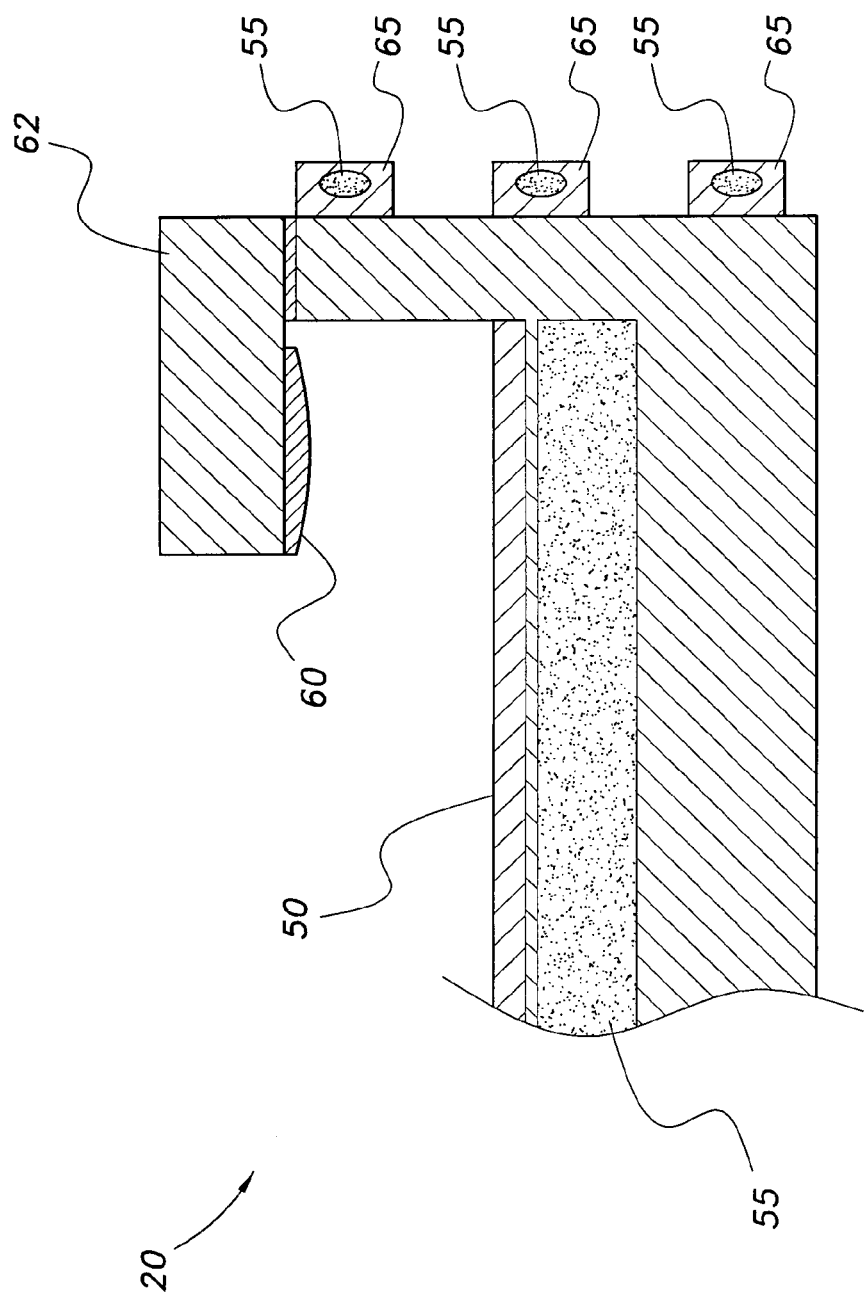
FIG. 4 is a cutaway section view of the C channel of the moving carbon nanotube heat sink according to the present invention.

As shown in FIG. 4, the C-channel 20 may also host a particulate composite that includes a matrix of resin and impregnated nanotubes 55 disposed therein. As shown in FIG. 6, the C-channel 20 conducts heat from the chip 17 to the moving belt 30 and also functions as a guide for the circulating belt 30. In order to enhance heat flow out of the C-channel 20, side fins 65, preferably having carbon nanotube fibers 55 may be disposed along a longitudinally extending portion of the C-channel 20. Clamping portions 62 of the C-channel 20 each have a preferably convex arcuate shaped compression boss 60 that compresses the moving belt 30 down towards belt-to-chip contact surfaces as the belt 30 passes along the C-channel 20 in order to ensure better contact between a lower surface of belt 30 and the contact layer of chip 17 to ensure thermal dissipation from the chip 17 via the belt 30. Moreover, disposition of the compression bosses 62 within the C-channel 20 reduces contact resistance (friction) which may otherwise be encountered at clamping portions 62 to thereby maximize heat transfer from the surface of chip 17.

Figure 5:
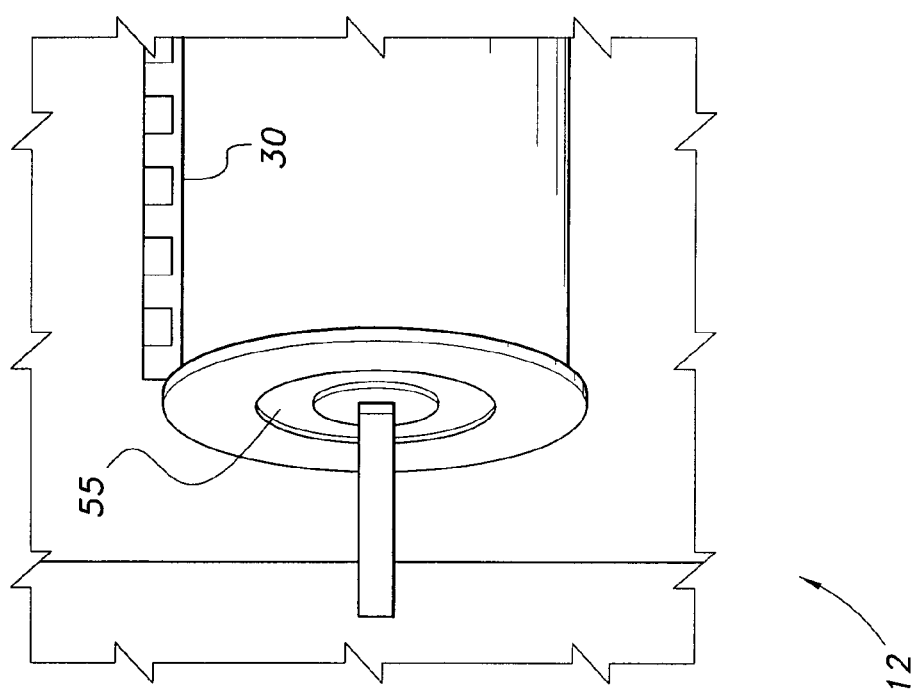
FIG. 5 is a perspective view of the roller and belt assemblies of the moving carbon nanotube heat sink according to the present invention.

The moving belt 30 is disposed over a plurality of rollers 12 and can move across heat emanating surface of electronic circuitry chip 17 by means of a gear or any other means as should be understood by those of ordinary skill in the art. Since the moving belt 30 is in sliding contact with a surface of C-shaped channel 20, the moving belt 30 acts as a moving heat sink having successive portions of the belt 30 come in contact with the C-shaped channel 20. As shown in FIG. 5, the roller 12 can also host a highly thermal conducting carbon nano particulate composite 55.

It is to be understood that the present invention is not limited to the embodiment described above, but encompasses any and all embodiments within the scope of the following claims.

We claim:

1. A moving carbon nanotube heat sink for cooling an electronic device, the moving carbon nanotube heat sink comprising:
    a belt configured for heat transfer and having a bottom outer surface and a top outer surface; a plurality of carbon nanotubes, the carbon nanotubes being disposed within the belt, an axial orientation of each of the nanotubes extending laterally across a width of the belt; the plurality of carbon nanotubes forming a structure of nanotubes that extends from proximate the bottom surface of the belt to proximate the top surface of the belt;
    a C channel disposed on a heat emanating surface of the electronic device, the belt being slidably disposed therein, to thereby cause mechanical and thermal contact between a portion of the belt outer surfaces and the heat emanating surface of the electronic device; and
    means for moving the belt relative to the heat emanating surface of the electronic device so as to continuously bring different portions of the heat transfer belt in slipping contact with the heat emanating surface of the electronic device.

2. The moving carbon nanotube heat sink according to claim 1, wherein the carbon nanotubes extend through a composite resin disposed within the belt.

3. The moving carbon nanotube heat sink according to claim 1, wherein the carbon nanotubes have a diameter of not more than 200 nm and an aspect ratio of at least 0.1.

4. The moving carbon nanotube heat sink according to claim 1, further comprising belt cooling fins disposed on and extending away from the top surface of the belt.

5. The moving carbon nanotube heat sink according to claim 4, further comprising at least one highly heat conductive carbon nanotube disposed within each of the belt cooling fins.

6. The moving carbon nanotube heat sink according to claim 5, wherein the at least one belt cooling fin nanotube is disposed within a composite resin.

7. The moving carbon nanotube heat sink according to claim 1, wherein the means for moving the belt further comprises carbon nanotube means for dissipating heat away from the means for moving the belt.

8. The moving carbon nanotube heat sink according to claim 1, further comprising at least one clamping portion of the C channel extending over the channel, the clamping portion including a compression boss adapted for contact with the upper surface of the belt, wherein when the belt is disposed within the C channel the compression boss compresses the belt down towards belt-to-chip contact surfaces as the belt passes along the C channel.

9. The moving carbon nanotube heat sink according to claim 1, wherein the C channel further comprises a contact surface adapted for contacting the heat conductive sliding layer of the belt, the C channel contact surface comprising a plurality of carbon nanotubes disposed within a composite resin.

10. The moving carbon nanotube heat sink according to claim 1, further comprising at least one C channel fin disposed on and extending away from a side surface of the C channel.

11. The moving carbon nanotube heat sink according to claim 10, wherein the at least one C channel fin nanotube is disposed within a composite resin.

* * * * *